United States Patent
Zhan et al.

(10) Patent No.: US 9,240,423 B2
(45) Date of Patent: Jan. 19, 2016

(54) DISPLAY DEVICE AND METHOD OF MANUFACTURING THE SAME

(75) Inventors: Zhi Feng Zhan, Chungcheongnam-do (KR); Seung-Gyu Tae, Yongin (KR); Deok-Hoi Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 550 days.

(21) Appl. No.: 13/283,380

(22) Filed: Oct. 27, 2011

(65) Prior Publication Data

US 2012/0326151 A1     Dec. 27, 2012

(30) Foreign Application Priority Data

Jun. 27, 2011 (KR) .......................... 10-2011-0062320

(51) Int. Cl.
   *H01L 33/08* (2010.01)
   *H01L 33/16* (2010.01)
   *H01L 27/12* (2006.01)
   *G02F 1/1362* (2006.01)

(52) U.S. Cl.
   CPC ...... *H01L 27/1255* (2013.01); *G02F 1/136213* (2013.01); *G02F 1/136227* (2013.01)

(58) Field of Classification Search
   CPC .......... H01L 33/08; H01L 33/16; H01L 27/32; H01L 51/50; H01L 27/1255
   USPC ....................................................... 257/59
   See application file for complete search history.

(56) References Cited

U.S. PATENT DOCUMENTS

| | | | | |
|---|---|---|---|---|
| 6,052,162 A | * | 4/2000 | Shimada et al. | 349/38 |
| 7,131,884 B2 | * | 11/2006 | Park | 445/24 |
| 7,202,565 B2 | * | 4/2007 | Matsuura et al. | 257/758 |
| 7,456,455 B2 | * | 11/2008 | Kutsunai et al. | 257/295 |
| 8,415,873 B2 | * | 4/2013 | Kang et al. | 313/504 |
| 2005/0212418 A1 | * | 9/2005 | Bae et al. | 313/506 |
| 2007/0103610 A1 | * | 5/2007 | Lee et al. | 349/38 |
| 2011/0122330 A1 | * | 5/2011 | Tae et al. | 349/39 |

FOREIGN PATENT DOCUMENTS

| | | |
|---|---|---|
| KR | 1020030092354 | 12/2003 |
| KR | 1020070029853 | 3/2007 |
| KR | 1020070049743 | 5/2007 |

* cited by examiner

*Primary Examiner* — Evan Pert
*Assistant Examiner* — Damon Hillman
(74) *Attorney, Agent, or Firm* — Knobbe Martens Olson & Bear LLP (57) ABSTRACT

A display device includes: an insulating substrate comprising a first region and a second region; a thin-film transistor (TFT) formed on the first region comprising a gate electrode, a source electrode, and a drain electrode; and a storage capacitor formed on the second region, wherein the storage capacitor comprises a first electrode, a second electrode and a first interlayer insulating film, where the first and second electrodes face each other and are made of a transparent conductive material, wherein the interlayer insulating film is interposed between the first electrode and the second electrode, and wherein the first electrode is formed on the entire surface of the first substrate as one body and receives a common voltage, and the second electrode is electrically connected to the drain electrode.

5 Claims, 10 Drawing Sheets

DISPLAY DEVICE AND METHOD OF MANUFACTURING THE SAME

CROSS-REFERENCE TO RELATED APPLICATIONS

This application claims priority from Korean Patent Application No. 10-2011-0062320 filed on Jun. 27, 2011 in the Korean Intellectual Property Office, the disclosure of which is incorporated by reference herein in its entirety.

BACKGROUND

1. Field

The present disclosure relates to a display device and a method of manufacturing the same, and more particularly, to a display device with an increased aperture ratio and a method of manufacturing the display device.

2. Description of Related Technology

The rapid development of the information technology (IT) industry is dramatically increasing the use of display devices. Recently, there have been demands for display devices that are lightweight and thin, consume low power and provide high resolution. To meet these demands, liquid crystal displays and organic light-emitting displays having a plurality of metal wirings and a plurality of light-emitting elements are being developed.

A storage capacitor of a display device is formed by the overlapping of a lower storage electrode and an upper storage electrode with an insulating film interposed therebetween. The storage capacitor is generally required to have a high capacitance value in order to maintain a pixel voltage signal in a stable manner and be applicable to high resolution display devices.

However, if an overlapping area of the upper and lower storage electrodes is increased to raise the capacitance value of the storage capacitor, an aperture ratio is reduced by the area occupied by the upper and lower storage electrodes.

SUMMARY OF CERTAIN INVENTIVE ASPECTS

Aspects of the present invention provide a display device including a storage capacitor with an increased aperture ratio and capacitance, and a method of manufacturing the display device.

However, aspects of the present invention are not restricted to the one set forth herein. The above and other aspects of the present invention will become more apparent to one of ordinary skill in the art to which the present invention pertains by referencing the detailed description given below.

According to one aspect, there is provided a display device comprising: an insulating substrate comprising a first region and a second region; a thin-film transistor (TFT) formed on the first region and comprising a gate electrode, a source electrode, and a drain electrode; and a storage capacitor formed on the second region, wherein the storage capacitor comprises a first electrode, a second electrode and a first interlayer insulating film, wherein the first and second electrodes face each other and are made of a transparent conductive material, wherein the first interlayer insulating film is interposed between the first electrode and the second electrode, and wherein the first electrode is formed on the entire surface of the first substrate as one body and receives a common voltage, and the second electrode is electrically connected to the drain electrode.

According to another aspect, there is provided a display device comprising: an insulating substrate comprising a first region and a second region; a TFT formed on the first region and comprising a gate electrode, a source electrode, and a drain electrode; a storage capacitor formed on the second region and comprising a first electrode, a second electrode formed on the first electrode, and a first interlayer insulating film formed between the first electrode and the second electrode; and a pixel electrode formed on the insulating substrate, wherein the first electrode and the second electrode include a transparent conductive material, the pixel electrode is electrically connected to the first electrode by a contact hole which penetrates the second electrode, the first electrode is electrically connected to the drain electrode, and a common voltage is applied to the second electrode.

According to another aspect, there is provided a method of manufacturing a display device, the method comprising: forming a gate electrode of a TFT on an insulating substrate; forming a first interlayer insulating film on the entire surface of the insulating substrate; forming a first electrode of a storage capacitor on the entire surface of the first interlayer insulating film; forming a second interlayer insulating film on the first electrode; forming a second electrode on the second interlayer insulating film; and depositing source and drain electrodes of the TFT, wherein a voltage is applied to each of the first electrode and the second electrode, and the first electrode and the second electrode are made of a transparent material.

BRIEF DESCRIPTION OF THE DRAWINGS

The above and other aspects and features of the present invention will become more apparent by describing in detail certain embodiments thereof with reference to the attached drawings, in which.

DETAILED DESCRIPTION OF CERTAIN INVENTIVE EMBODIMENTS

The present invention will now be described more fully hereinafter with reference to the accompanying drawings, in which certain embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers generally indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which certain embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Figure 1:
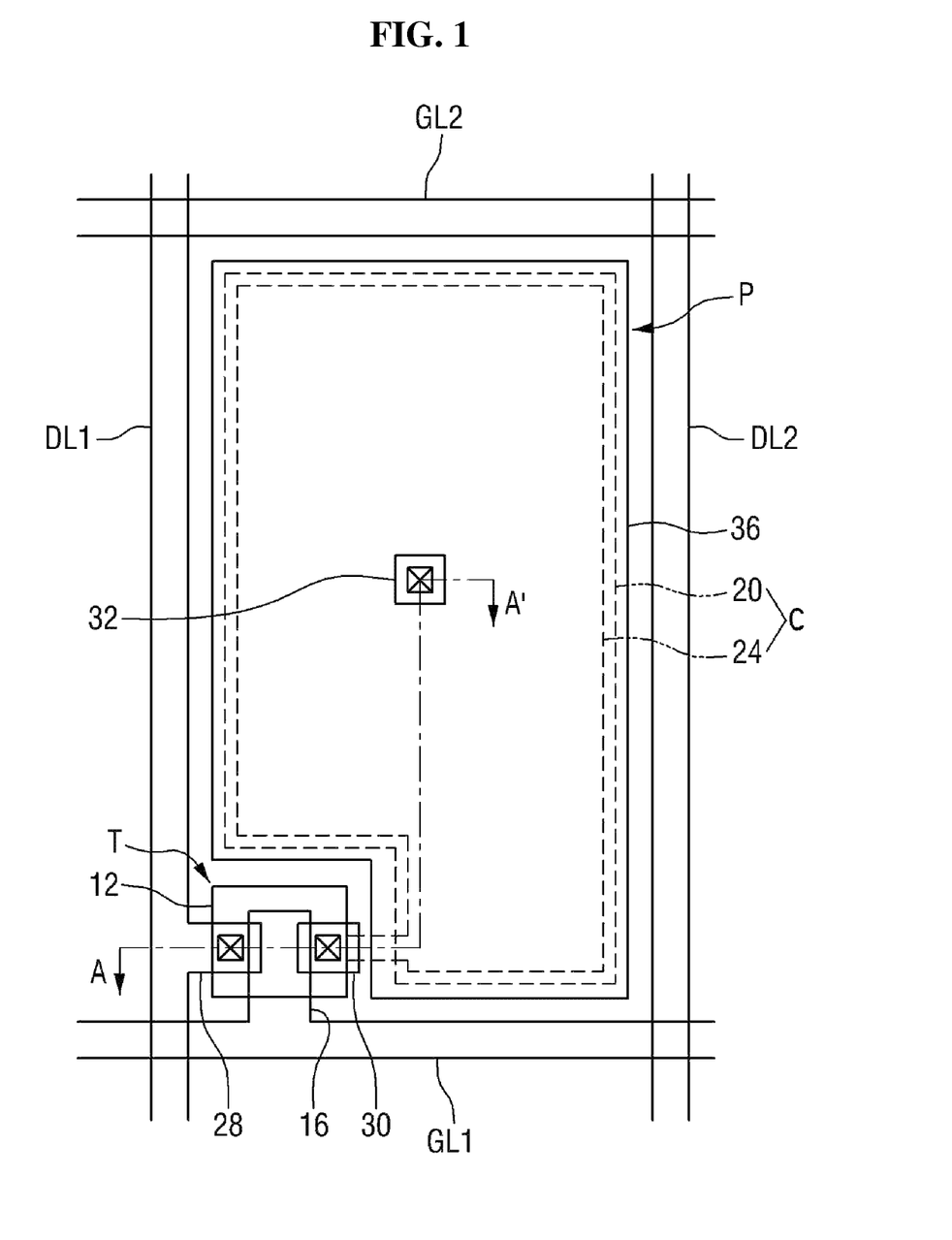
FIG. 1 is a schematic plan view of an embodiment of a display device.
Figure 2:
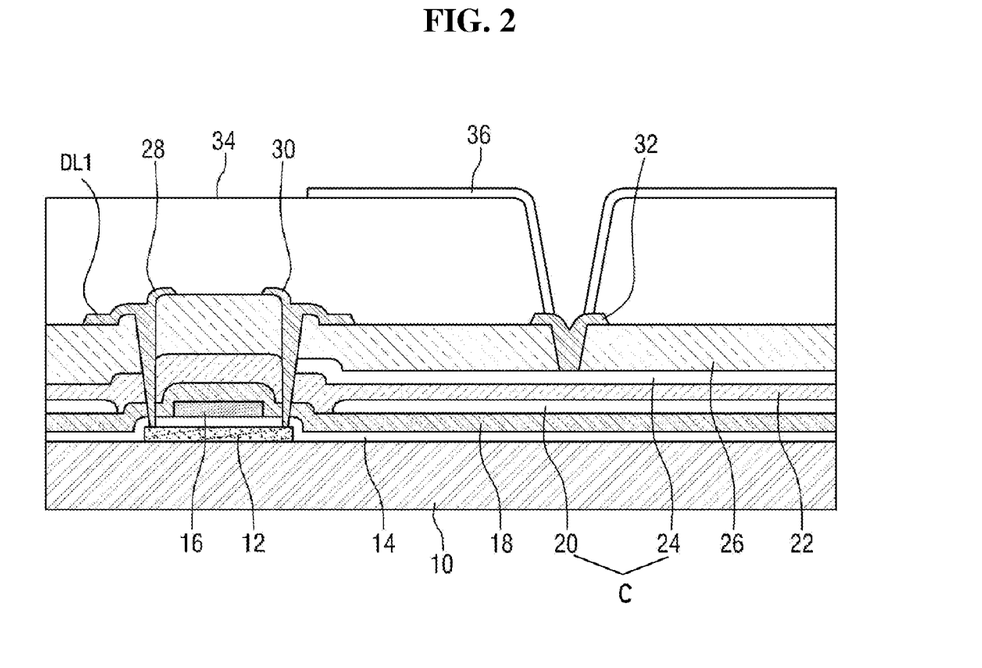
FIG. 2 is a cross-sectional view taken along the line A-A' of FIG. 1.
Figure 3:
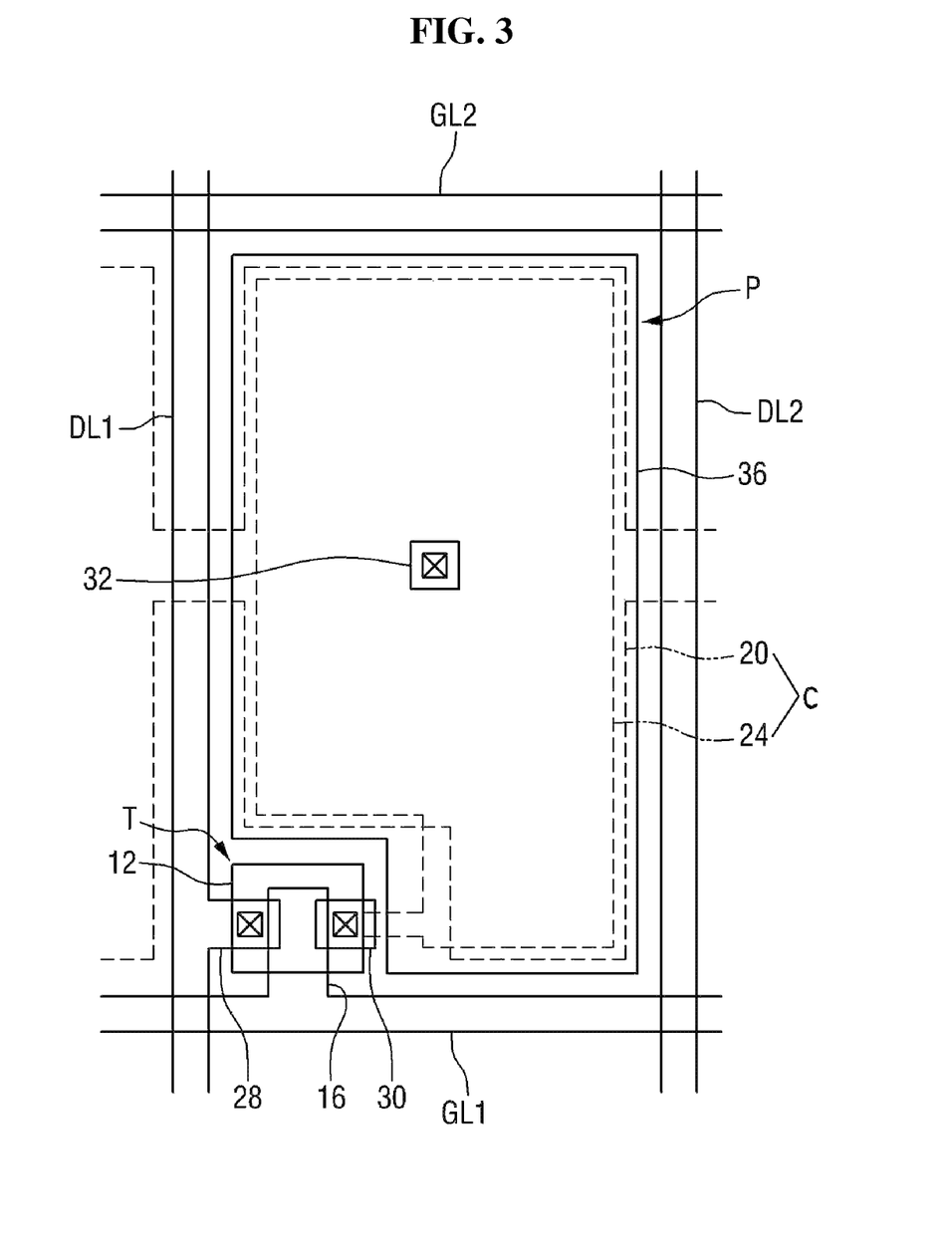
FIG. 3 is a schematic plan view of another embodiment of a display device.
Figure 4:
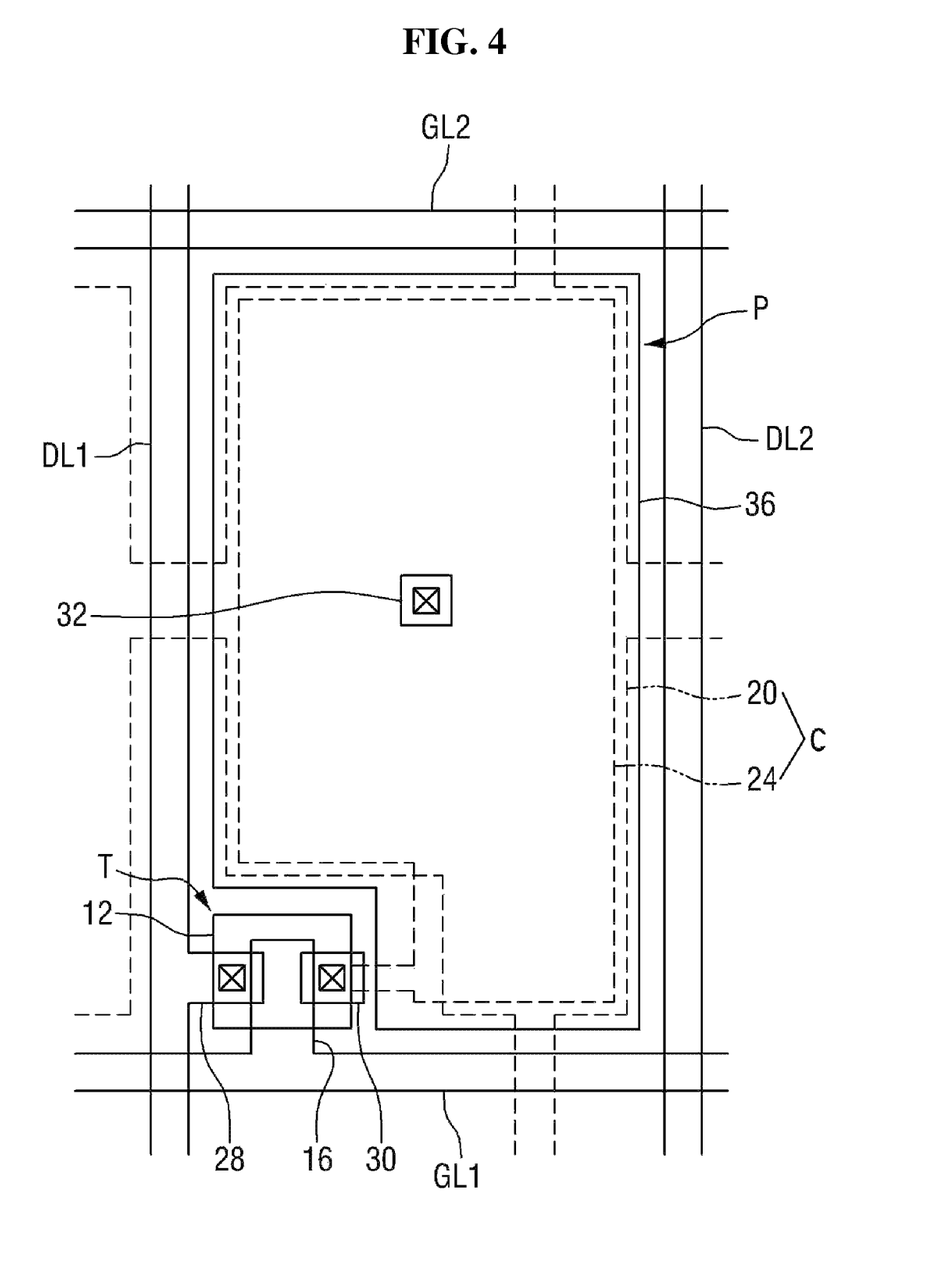
FIG. 4 is a schematic plan view of another embodiment of a display device.

Hereinafter, display devices according to embodiments of the present invention will be described with reference to FIGS. 1 through 4. FIG. 1 is a schematic plan view of an embodiment of a display device. FIG. 2 is a cross-sectional view taken along the line A-A' of FIG. 1. FIG. 3 is a schematic plan view of another embodiment of a display device. FIG. 4 is a schematic plan view of another embodiment of a display device.

Referring to FIGS. 1 and 2, an embodiment of the display device includes a first substrate 10, a thin-film transistor (TFT) T which is formed on a first region of the first substrate 10 and includes a gate electrode 16 and source and drain electrodes 28 and 30, and a storage capacitor C which is formed on a second region of the first substrate 10. First and second electrodes 20 and 24 of the storage capacitor C are made of a transparent conductive material. A common voltage Vcom (not shown) is applied to the first electrode 20, and the second electrode 24 is connected to the source and drain electrodes 28 and 30 to receive a driving voltage. The first electrode 20 is formed on the entire surface of the first substrate 10 as one body.

Referring to FIG. 1, an embodiment of the display device may include a plurality of gate lines GL1 and GL2, a plurality of data lines DL1 and DL2 which intersect the gate lines GL1 and GL2, a pixel region P which is formed by the intersection of the gate lines GL1 and GL2 and the data lines DL1 and DL2, the TFT T which is formed in the pixel region P, and the storage capacitor C.

The gate lines GL1 and GL2 receive signals from an external circuit board (not shown) and transmit the received signals to the gate electrode 16 of the TFT T. As will be described below, the gate electrode 16 controls a semiconductor layer 12 such that a signal is selectively transmitted between the source electrode 28 and the drain electrode 30. The gate lines GL1 and GL2 may be parallel to each other and may be formed on a surface of the first substrate 10 to extend in a direction.

The data lines DL1 and DL2 may be formed on the first substrate 10 to intersect the gate lines GL1 and GL2 in a direction perpendicular to the gate lines GL1 and GL2. The gate lines GL1 and GL2 and the data lines DL1 and DL2 may intersect each other in the direction perpendicular to each other to define the pixel region P. The data lines DL1 and DL2 may receive data signals from an external source (not shown) and transmit the received data signals to the source electrode 28 of the TFT T. In response to a control signal from the gate electrode 16, a driving voltage may be delivered from the source electrode 28 to the drain electrode 30 and to a pixel electrode 36 connected to the drain electrode 30. Accordingly, the pixel electrode 36 may form an electric field together with a common electrode (not shown) of a second substrate.

The TFT T may be formed in a portion of the pixel region P formed by the intersection of the gate lines GL1 and GL2 and the data lines DL1 and DL2 in the direction perpendicular to each other. In the embodiment shown in FIG. 1, the TFT T is formed at a corner of the pixel region P. In other embodiments, the TFT T may be formed in other locations of the pixel region P.

The TFT T may include the semiconductor layer 12, the gate electrode 16, the source electrode 28, and the drain electrode 30. The TFT T may control the semiconductor layer 12 according to a gate voltage of the gate electrode 16 such that a driving voltage is selectively delivered between the source electrode 28 and the drain electrode 30.

Referring to FIGS. 1 and 2, the TFT T may include the first substrate 10, the semiconductor layer 12 formed on the first substrate 10, a gate insulating film 14 formed on the semiconductor layer 12 to insulate the semiconductor layer 12 from the gate electrode 16, the gate electrode 16 to which a gate signal is transmitted, a plurality of interlayer insulating films 18, 22 and 26 formed on the gate electrode 16, the source electrode 28 and the drain electrode 30 formed on the interlayer insulating films 18, 22 and 26.

The first substrate 10 may be an insulating substrate made of a transparent glass material containing $SiO_2$ as a main component. The first substrate 10 may also be made of transparent plastic. The plastic that forms the first substrate 10 may include an insulating organic material. In various embodiments, the insulating organic material may include polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), cellulose acetate propionate (CAP), and/or a combination of these materials.

One or more buffer layers (not shown) may be formed on the first substrate 10 to planarize the first substrate 10 and prevent penetration of impurities into the first substrate 10. Each of the buffer layers may be a single layer of SiOx, SiNx or $SiO_2Nx$, or a multilayer of these materials.

The semiconductor layer 12 may be formed on the first substrate 10. The semiconductor layer 12 forms a conducting channel between the source electrode 28 and the drain electrode 30. The semiconductor layer 12 may contain, for example, silicon (Si). In some embodiments, the semiconductor layer 12 may be an amorphous silicon (a-Si) layer or a polycrystalline silicon (p-Si) layer. In other embodiments, the semiconductor layer 12 may be made of, for example, Ge, GaP, GaAs, AlAs, or the like.

A portion of the semiconductor layer 12 may be doped with P- or N-type impurities. In some embodiments, the semiconductor layer 12 of the TFT T may be partially doped with impurities to have semiconductor properties. A portion of the semiconductor layer 12 may be made of a-Si undoped with impurities, and the other portion of the semiconductor layer 12 may be made of a-Si doped with N- or P-type impurities. When a gate signal is transmitted to the gate electrode 16, the semiconductor layer 12 provides a voltage applied to the source electrode 28 to the drain electrode 30.

The gate insulating film 14 may be formed on the semiconductor layer 12 to cover the semiconductor layer 12 and insulate the semiconductor layer 12 from the gate electrode 16. Like the buffer layers, the gate insulating film 14 may be a single layer of $SiO_2$, SiNx or $SiO_2Nx$, or a multilayer of these materials. The gate insulating film 14 may be made of the same or different material as the buffer layers.

The gate electrode 16 may be formed on the gate insulating film 14. The gate electrode 16 may branch from the gate line GL1 and receive a gate signal. The gate electrode 16 may be a single layer of Al, Ag, Cu, Mo, Cr, Ti, Ta or an alloy of these materials, or a multilayer composed of two or more such single layers.

As described above, the gate electrode 16 may form a conducting channel in the semiconductor layer 12 when receiving a gate voltage from an external source via the gate line GL1.

The interlayer insulating films 18, 22 and 26 may be formed on the gate electrode 16. The interlayer insulating films 18, 22 and 26 electrically insulate the gate electrode 16 from the source and drain electrodes 28 and 30. Like the buffer layers, each of the interlayer insulating films 18, 22 and 26 may be a single layer of $SiO_2$, SiNx or $SiO_2Nx$, or a multilayer of these materials.

The interlayer insulating film 22 interposed between the first electrode 20 and the second electrode 24, which constitute the storage capacitor C, functions as a dielectric between the first electrode 20 and the second electrode 24. Therefore, the interlayer insulating film 22 may be made of SiNx whose dielectric constant is higher than that of $SiO_2$ in order to increase capacitance in the same area.

Contact holes for forming the source and drain electrodes 28 and 30 may be formed in the interlayer insulating films 18, 22 and 26. A metal material may be deposited in the contact holes to form the source and drain electrodes 28 and 30.

The source and drain electrodes 28 and 30 may be formed on the interlayer insulating films 18, 22 and 26. The source electrode 28 may branch from the data line DL1 and may be electrically connected to the semiconductor layer 12 by one of the contact holes. The drain electrode 30 may be separated from the source electrode 28 and may face the source electrode 28 with respect to the gate electrode 16. The drain electrode 30 may be electrically connected to the semiconductor layer 12 by the other one of the contact holes. Each of the source and drain electrodes 28 and 30 may be a single layer of Al, Ag, Cu, Mo, Cr, Ti, Ta or an alloy of these materials, or a multilayer composed of two or more such single layers. The TFT T configured as described above controls the semiconductor layer 12 according to a gate voltage of the gate electrode 16, thus functioning as a switching element that selectively delivers a driving voltage between the source electrode 28 and the drain electrode 30.

The storage capacitor C may be formed by the overlapping of the first electrode 20 and the second electrode 24 formed on the gate insulating film 14. The first electrode 20 which is a lower electrode of the storage capacitor C may be formed of a transparent conductive material on a different layer from the gate electrode 16. The interlayer insulating film 18 is formed over the entire surface of the first substrate 10 having the gate electrode 16, and the first electrode 20 is formed on the interlayer insulating film 18. Accordingly, a short circuit between the gate electrode 16 and the first electrode 20 can be prevented. The first electrode 20 of the storage capacitor C may be made of, for example, indium tin oxide (ITO), tin oxide (TO), indium zinc oxide (IZO), or indium tin zinc oxide (ITZO).

The second electrode 24 which forms an upper electrode of the storage capacitor C overlaps the first electrode 20 and is electrically connected to the drain electrode 30. The second electrode 24 may be made of the same transparent conductive material as the first electrode 20. The second electrode 24 is electrically connected to the pixel electrode 36 by a contact hole. A connecting electrode 32 may additionally be formed on the second electrode 24 and may be exposed through the contact hole.

The connecting electrode 32 may be made of a material with lower resistance than that of a transparent conductive material. In some embodiments, the connecting electrode 32 may be made of the same material as the source and drain electrodes 28 and 30 to reduce the resistance of the second electrode 24. The connecting electrode 32 is electrically connected to the pixel electrode 36.

As shown in FIGS. 1 and 2, when a pixel of the display device is small, the storage capacitor C may be located in a transmissive region of the pixel region P due to space restraints. The transmissive region denotes a region in which the pixel electrode 36 formed on the first substrate 10 is overlapped by the common electrode (not shown) formed on the second substrate (not shown). In particular, referring to FIG. 2, a portion of the pixel electrode 36 may overlap the first and second electrodes 20 and 24.

If the first and second electrodes 20 and 24 that constitute the storage capacitor C are made of an opaque metal, the transmissive region of the display device is reduced, thereby significantly reducing an aperture ratio.

Therefore, in some embodiments, the first and second electrodes 20 and 24 that constitute the storage capacitor C are made of a transparent conductive material to overcome the problem of a reduction in aperture ratio.

Of various display devices, a liquid crystal display (LCD) employs a backlight unit (not shown) which provides light under the first substrate 10. Thus, the transmittance of light emitted from the backlight unit is relatively important in the LCD.

If the first and second electrodes 20 and 24 are made of an opaque conductive material, when the area of the storage capacitor C is increased to maintain desired transmittance, it cannot be sufficiently increased or can only be increased in a limited quantity. Such limited expansion makes it difficult to fully secure the capacitance of the storage capacitor C.

In various embodiments, at least one of the first and second electrodes 20 and 24 of the storage capacitor C may contain a transparent conductive material. In some embodiments, the first electrode 20 and the second electrode 24 may contain a transparent conductive material and an opaque conductive material, respectively. In other embodiments, the first electrode 20 and the second electrode 24 may contain an opaque conductive material and a transparent conductive material, respectively. In yet other embodiments, both of the first electrode 20 and the second electrode 24 may contain a transparent conductive material.

Some examples of the transparent conductive material may include ITO, TO, IZO, and ITZO. These materials may be used alone or in mixture.

Even if the area of at least one of the first electrode 20 and the second electrode 24 is increased, a reduction in transmittance is relatively small. Therefore, to increase the capacitance between the first electrode 20 and the second electrode 24, the areas of the first electrode 20 and the second electrode 24 can be increased with limited concern regarding problems caused by a reduction in transmittance.

The pixel electrode 36 may substantially correspond to the transmissive region. In some embodiments, at least one of the first electrode 20 and the second electrode 24 may be extended to substantially correspond to the pixel electrode 36. In other embodiments, at least one of the first electrode 20 and the second electrode 24 may be formed wider than the pixel electrode 36. In such embodiments, at least one of the first electrode 20 and the second electrode 24 may overlap a black matrix pattern (not shown) located in a non-transmissive region.

In the embodiment shown in FIG. 1, both of the first electrode 20 and the second electrode 24 are narrower than the pixel electrode 36. However, the present invention is not limited thereto.

Even when at least one of the first electrode 20 and the second electrode 24 is formed as wide as the entire transmissive region such that it is overlapped by the pixel electrode 36 substantially corresponding to the transmissive region of a pixel, a reduction in transmittance is relatively small.

Therefore, the first and second electrodes 20 and 24 can be designed with limited concern regarding problems caused by a reduction in transmittance. In addition, one of the first electrode 20 and the second electrode 24 can be extended up to the non-transmissive region in order to increase capacitance.

To increase transmittance, a storage wiring (not shown) formed of the same material as a gate line in the same process may be removed from the first electrode 20 or the second electrode 24 of the storage capacitor C.

In some embodiments, the common voltage Vcom may be applied to the first electrode 20 of the storage capacitor C, and a data voltage (a driving voltage) may be applied to the second electrode 24, thus generating a predetermined capacitance. In such embodiments, a storage wiring made of the same metal material as a gate line is formed under the first electrode 20, and the common voltage Vcom applied to the common electrode (not shown) of the second substrate (not shown) is applied to the storage wiring.

If the storage wiring penetrates a portion (such as, for example, the middle) of the pixel region P such that the common voltage Vcom can be applied to the first electrode 20 of each pixel, since light cannot transmit through the storage wiring, the aperture ratio is reduced.

To avoid a reduction in aperture ratio, the storage capacitor C does not include the storage wiring. Instead, the first electrode 20 or the second electrode 24 to which the common voltage Vcom is applied is extended to one side so as to replace the storage wiring.

The first and second electrodes 20 and 24 made of a transparent conductive material have higher resistance values than the conventional storage wiring, causing a voltage drop. To prevent this problem, the first electrode 20 or the second electrode 24 to which the common voltage Vcom is applied may be formed on the entire surface of the first substrate 10 as one body.

When the first electrode 20 or the second electrode 24 is formed on the entire surface of the first substrate 10 as one body, a plurality of sections of the first electrode 20 or the second electrode 24 may be physically and electrically connected to each other at boundaries of a plurality of pixel regions formed on the first substrate 10. However, the entire portion of each section of the first electrode 20 or the second electrode 24 is not necessarily connected to the entire portion of another section. In some embodiments, the first electrode 20 or the second electrode 24 may be formed on the entire surface of the first substrate 10 as one body, and at least a portion of each section of the first electrode 20 or the second electrode 24 in each pixel region may be connected to at least a portion of another section in a neighboring pixel region at a boundary between the two pixel regions. Accordingly, all sections of the first electrode 20 and the second electrode 24 may be physically and electrically connected to each other. However, the first electrode 20 or the second electrode 24 may be patterned in a region in which the TFT T is formed in each pixel region and thus may not be provided in the region of the TFT T.

If the surface area of the first electrode 20 or the second electrode 24 to which the common voltage Vcom is applied is wide, the resistance value of the first electrode 20 or the second electrode 24 can be reduced to a value similar to the resistance value of the conventional storage wiring made of metal.

Referring to FIG. 2, the first electrode 20 from which the storage wiring is removed and which receives the common voltage Vcom directly from an external source is formed on the entire region of the first substrate 10 which excludes the region of the TFT T. Thus, the resistance of the first electrode 20 can be reduced.

In some embodiments, the second electrode 24 may be connected to the drain electrode 30 to receive a data voltage and may form the storage capacitor C together with the first electrode 20.

The connecting electrode 32 may be formed on the second electrode 24 and may penetrate the interlayer insulating film 26 to be connected to the pixel electrode 36 thereon. The connecting electrode 32 formed on the second electrode 24 may be island-shaped. The connecting electrode 32 may be made of the same material as the source electrode 28 and the drain electrode 30 of the TFT T. That is, the connecting electrode 32 may contain metal with low resistance.

In this structure, a data voltage applied to the drain electrode 30 may be delivered to the second electrode 24 and then to the pixel electrode 36 via the connecting electrode 32 connected to the second electrode 24.

Thus, this structure negates the need to extend the opaque drain electrode 30 in order to apply the data voltage to the pixel electrode 36 and increases the aperture ratio. That is, the drain electrode 30 and the connecting electrode 32 may be separated from each other but may be electrically connected to each other by the second electrode 24.

A passivation film 34 is formed between the second electrode 24 and the pixel electrode 36. The passivation film 34 covers the source electrode 28, the drain electrode 30, the second electrode 24, and the connecting electrode 32. The passivation film 34 may be made of an inorganic material such as silicon nitride, an organic insulating material, or a stack of two or more layers containing all of these materials. The passivation film 34 may be formed by plasma enhanced chemical vapor deposition (PECVD), spin coating, or spinless coating.

Other embodiments of the first electrode 20 are illustrated in FIGS. 3 and 4. A section of the first electrode 20 in each pixel is not separated from another section in a neighboring pixel. Instead, at least a portion of a section of the first electrode 20 in each pixel is connected to at least a portion of another section in a neighboring pixel at a boundary between the two pixels. Thus, the first electrode 20 as a whole is formed on the entire first substrate 10 as one body. Since all sections of the first electrode 20 are connected to each other across all pixels, the resistance value of the first electrode 20 made of a transparent conductive material can be reduced.

In the embodiment shown in FIG. 3, a section of the first electrode 20 in each pixel may be connected to other sections in pixels on right and left sides of the pixel. To reduce the parasitic capacitance between the first electrode 20 and the data lines DL1 and DL2, an overlapping area between the first electrode 20 and each of the data lines DL1 and DL2 may be minimized.

In the embodiment shown in FIG. 4, a section of the first electrode 20 in each pixel may be connected to other sections in pixels on upper, lower and right and left sides of the pixel. To reduce the parasitic capacitance between the first electrode 20 and the data lines DL1 and DL2 and the parasitic capacitance between the first electrode 20 and the data lines DL1 and DL2, each overlapping area may be minimized.

In some other embodiments, the first electrode 20 may be formed as one body on the entire region of the first substrate 10 which excludes the region of the TFT T.

Figure 5:
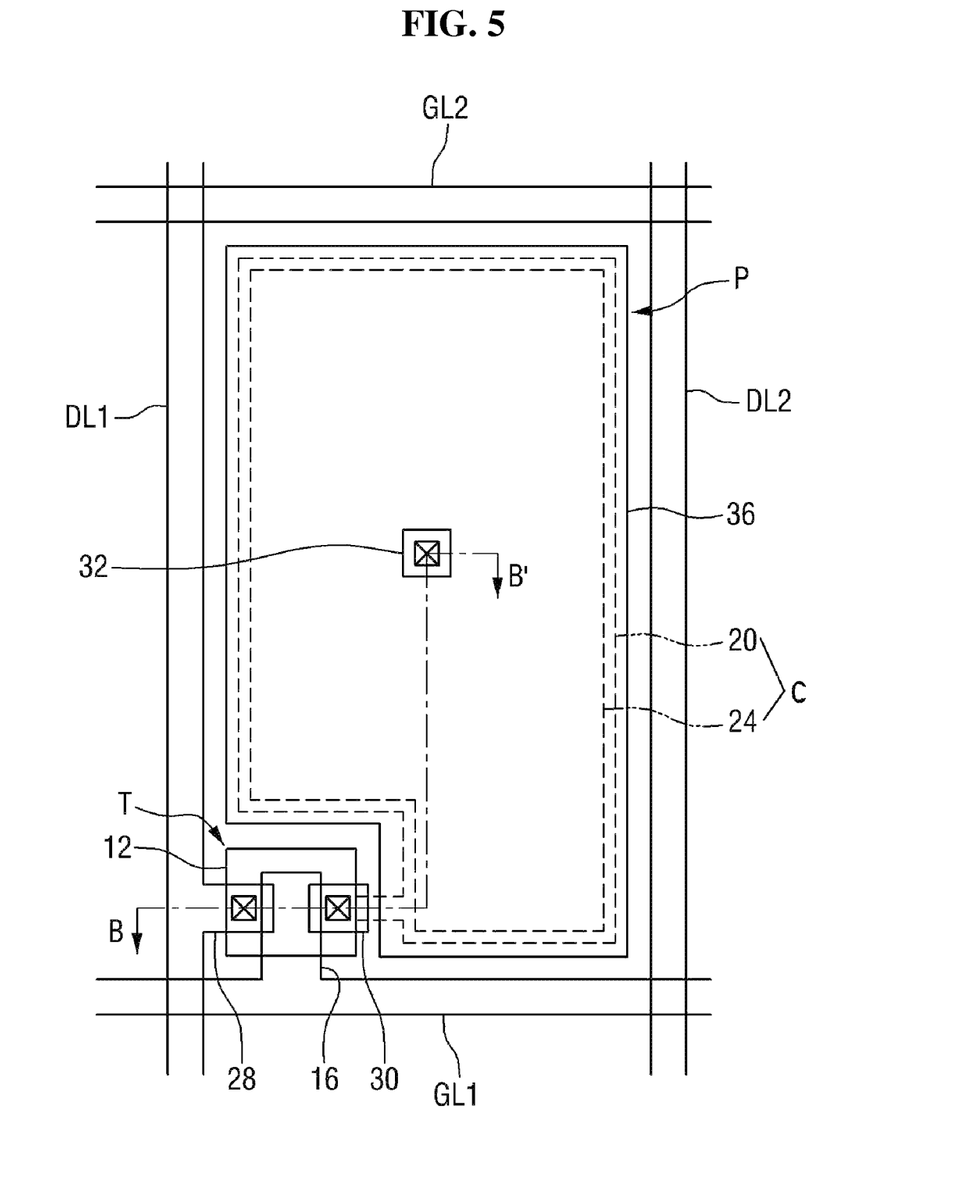
FIG. 5 is a schematic plan view of another embodiment of a display device.
Figure 6:
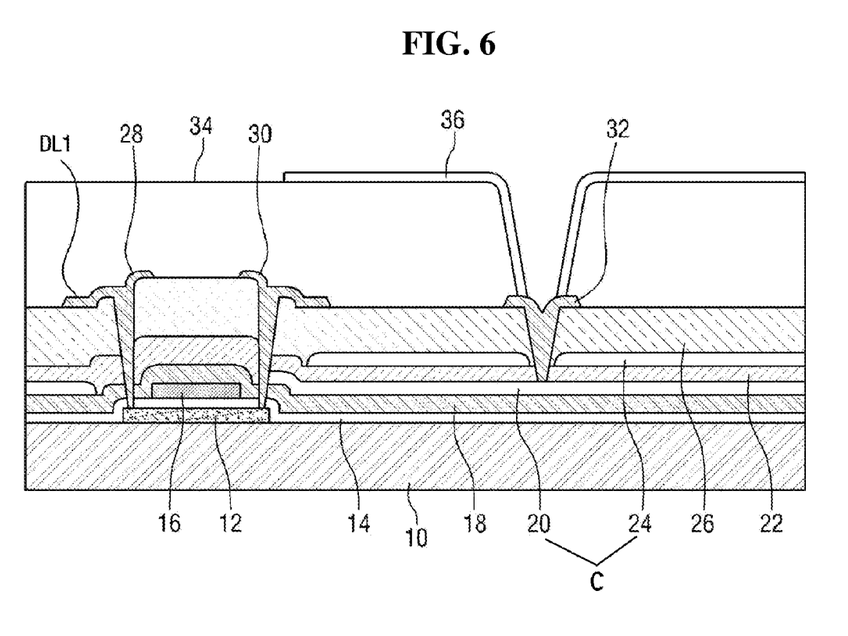
FIG. 6 is a cross-sectional view taken along the line B-B' of FIG. 5.

Hereinafter, another embodiment of a display device will be described with reference to FIGS. 5 and 6. FIG. 5 is a schematic plan view of another embodiment of a display device. FIG. 6 is a cross-sectional view taken along the line B-B' of FIG. 5.

The display device includes a first substrate 10, a TFT T which is formed on a first region of the first substrate 10 and includes a gate electrode 16 and source and drain electrodes 28 and 30, a storage capacitor C which is formed on a second region of the first substrate 10 and includes a first electrode 20, a second electrode 24 formed on the first electrode 20, and an interlayer insulating film 22 formed between the first electrode 20 and the second electrode 24, and a pixel electrode 36 which is formed on the first substrate 10. The first electrode 20 and the second electrode 24 are made of a transparent conductive material, and the pixel electrode 36 is connected to the first electrode 20 by a contact hole which penetrates the second electrode 24. The first electrode 20 is connected to the source and drain electrodes 28 and 30. Accordingly, a driving voltage is applied to the first electrode 20, and a common voltage Vcom is applied to the second electrode 24.

The display device shown in FIGS. 5 and 6 is identical to the display device of FIGS. 1 and 2 except that voltages applied respectively to the first electrode 20 and the second electrode 24 of the storage capacitor C are the opposite of those in the previous embodiment.

Referring to FIG. 6, the first electrode 20 which forms a lower electrode of the storage capacitor C extends toward the TFT T to be connected to the drain electrode 30, and a portion of the first electrode 20 is connected to the pixel electrode 36 by a connecting electrode 32. Therefore, a data voltage (a driving voltage) may be applied to each of the first electrode 20 and the pixel electrode 36.

The pixel electrode 36 may penetrate part of the second electrode 24, and the second electrode 24 and the pixel electrode 36 may be separated by a predetermined gap to be insulated from each other. The second electrode 24 may be formed as one body on the entire region of the first substrate 10 which excludes the TFT T, such that the common voltage Vcom can be applied from an external source directly to the second electrode 24 without a storage wiring.

Figure 7:
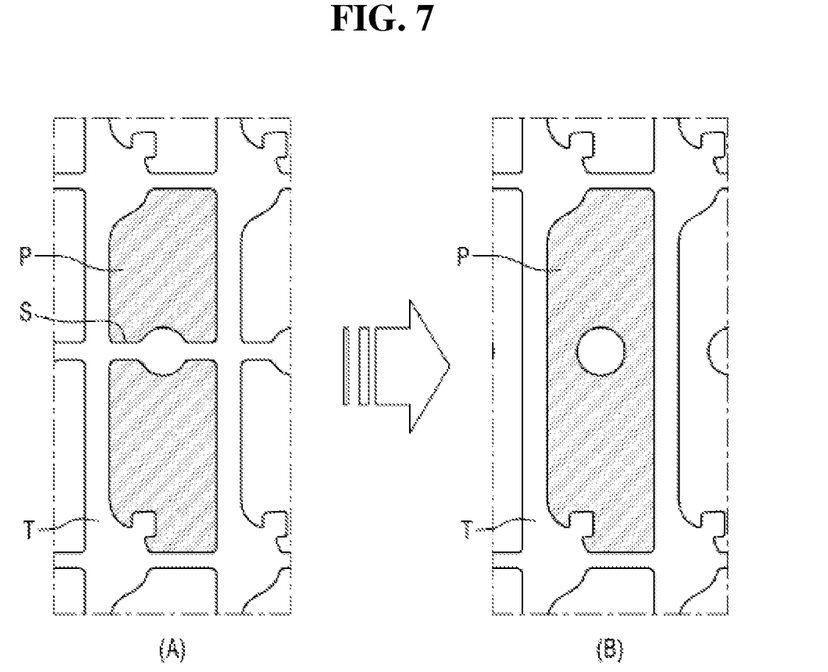
FIG. 7 is a diagram illustrating an increase in aperture ratio according to embodiments of the present invention.

In FIG. 7, transmissive regions according to embodiments of the present invention are illustrated, and an increase in aperture ratio can be identified. Referring to (A) of FIG. 7, a storage wiring S made of opaque metal reduces the aperture ratio. On the other hand, referring to (B) of FIG. 7, the storage wiring S is replaced by a transparent electrode which is formed on the entire surface of a substrate as one body. Thus, the aperture ratio is increased by the area previously occupied by the storage wiring.

Lower and upper electrodes of a storage capacitor may be formed of a transparent conductive material to be as wide as the entire transmissive region of each pixel, thereby securing a high aperture ratio as well as sufficient capacitance. In addition, since a storage wiring is removed, the aperture ratio can be additionally increased. The increased aperture ratio may increase a pixel density per inch (ppi) from conventional 330 ppi to more than approximately 400 ppi.

Furthermore, although first and second electrodes (i.e., the lower and upper electrodes) of the storage capacitor are made of a transparent conductive material having relatively higher resistance than metal, since the first electrode and/or the second electrode is formed on the entire surface of a substrate to maximize the surface area thereof, an increase in resistance due to the transparent conductive material can be reduced.

Hereinafter, an embodiment of a method of manufacturing a display device will be described with reference to FIGS. 8A through 8I. FIGS. 8A through 8I are cross-sectional views illustrating processes in an embodiment of a method of manufacturing a display device.

An embodiment of the method of manufacturing a display device includes forming a gate electrode of a TFT on a first substrate, forming a first interlayer insulating film on the entire surface of the first substrate, forming a first electrode of a storage capacitor on the entire surface of the first interlayer insulating film, forming a second interlayer insulating film on the first electrode, forming a second electrode on the second interlayer insulating film, and depositing source and drain electrodes of the TFT. A driving voltage or a common voltage is applied to each of the first electrode and the second electrode, and the first electrode and the second electrode are made of a transparent conductive material.

Figure 8A:
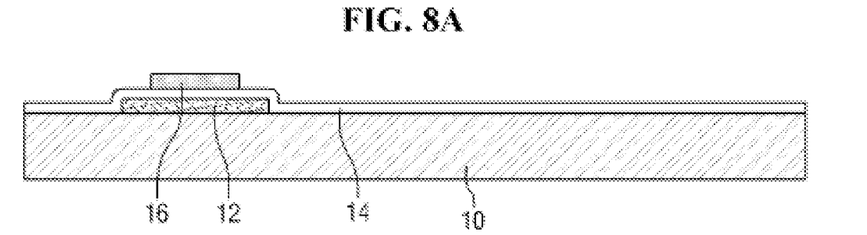
FIGS. 8A through 8I are cross-sectional views illustrating processes in an embodiment of a method of manufacturing a display device.

Referring to FIG. 8A, a semiconductor layer 12 is formed on a first region of a first substrate 10 on which a TFT T is to be formed. The semiconductor layer 12 may be formed by sequentially depositing an amorphous silicon layer and another amorphous silicon layer doped with impurities. In other embodiments, the semiconductor layer 12 may be formed by depositing amorphous silicon and then selectively doped in a subsequent process.

The amorphous silicon layer and the amorphous silicon layer doped with impurities may be patterned by a photolithography process and an etching process, thereby forming the semiconductor layer 12.

A gate insulating film 14 may be formed by depositing an inorganic insulating material such as SiOx or SiNx on the entire surface of the first substrate 10 using a deposition method such as PECVD.

A gate electrode 16 is formed on the gate insulating film 14. The gate electrode 16 is stacked on the first substrate 10 using a deposition method such as sputtering. As described above, the gate electrode 16 may be made of Al, Mo, Cr, or Cu.

Figure 8B:
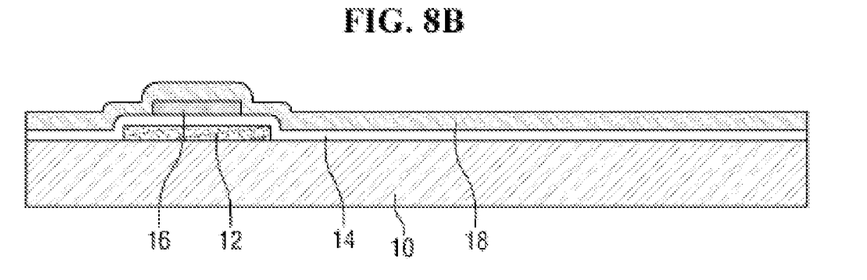

Referring to FIG. 8B, an interlayer insulating film 18 is formed by depositing an inorganic insulating material such as SiOx and/or SiNx on the first substrate 10 using a deposition method such as PECVD.

Figure 8C:
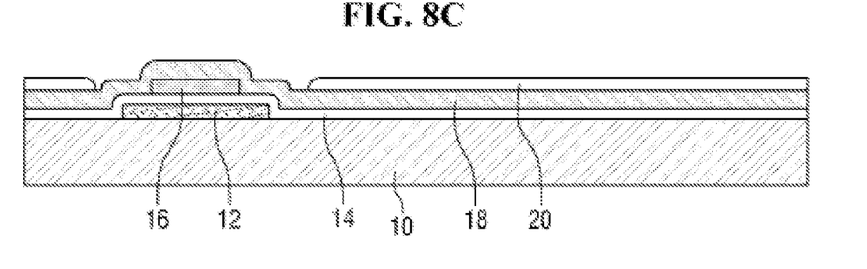

Referring to FIG. 8C, a first electrode 20 is formed on the interlayer insulating film 18. The first electrode 20 may be formed on a region of the first substrate 10, on which a storage capacitor C is to be formed, by using various deposition methods. As described above, the first electrode 20 of the storage capacitor C may be made of a transparent conductive material such as ITO, TO, IZO or ITZO, or a mixture of these materials. In addition, the first electrode 20 may be formed on the entire surface of the first substrate 10 as one body. In other embodiments, the first electrode 20 may be formed on the entire surface of the first substrate 10 which excludes the region of the TFT T, in order to prevent a short circuit between itself and a source electrode 28 and/or a drain electrode 30 of the TFT T.

Figure 8D:
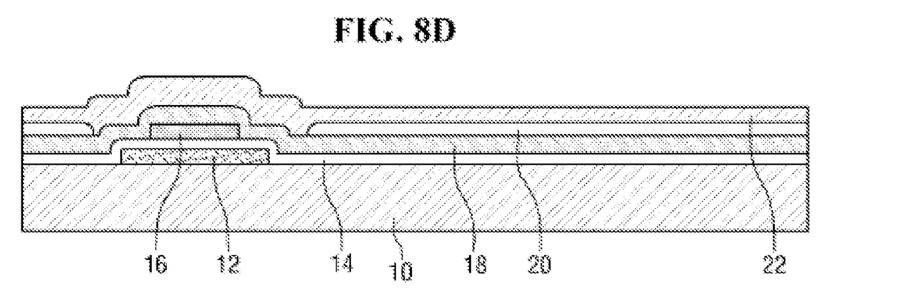

Referring to FIG. 8D, an interlayer insulating film 22 is formed on the first electrode 20. The interlayer insulating film 22 may be formed by depositing an inorganic insulating material such as SiOx and/or SiNx on the first substrate 10 using a deposition method such as PECVD.

Since the interlayer insulating film 22 is formed between the first electrode 20 and a second electrode 24, and thus functions as a dielectric of the storage capacitor C, it may be made of SiOx having a relatively higher dielectric constant than SiNx in order to increase capacitance.

Figure 8E:
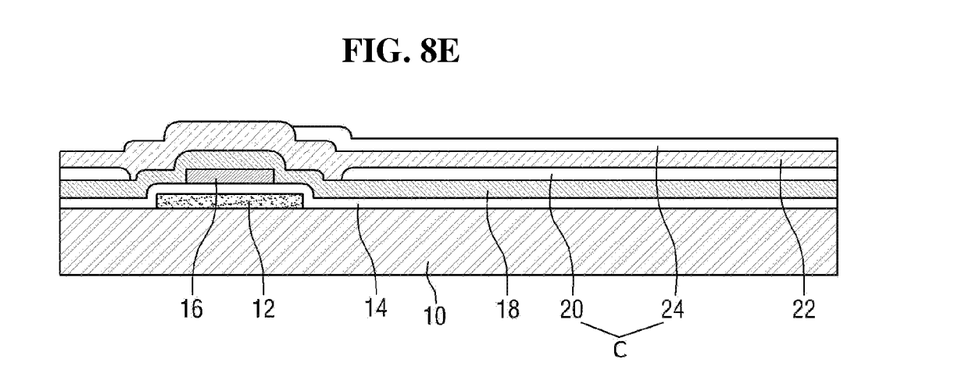

Referring to FIG. 8E, the second electrode 24 of the storage capacitor C is formed on the interlayer insulating film 22. Like the first electrode 20, the second electrode 24 may be made of a transparent conductive material in the region of the storage capacitor C by using a deposition method. In some embodiments, the second electrode 24 may be made of any one of ITO, TO, IZO and ITZO.

Through a subsequent processes of forming a contact hole and depositing the drain electrode 30, the second electrode 24 is connected to the drain electrode 30 so as to receive a driving voltage from the drain electrode 30.

Figure 8F:
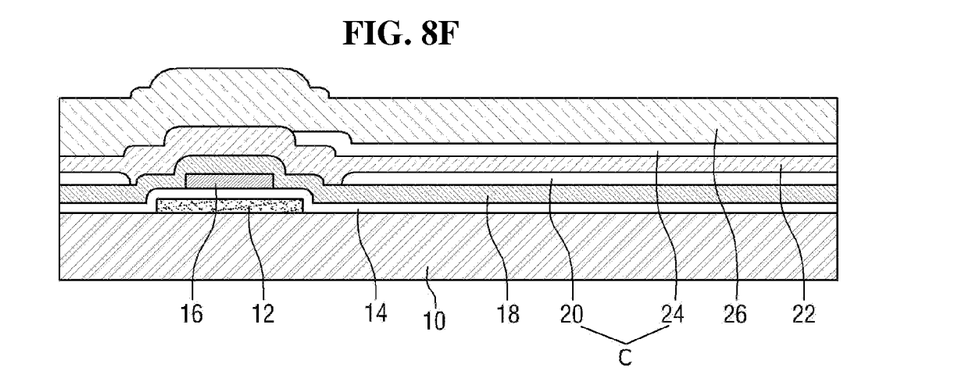

Referring to FIG. 8F, an interlayer insulating film 26 is formed on the second electrode 24. The interlayer insulating film 26 may be formed by depositing an inorganic insulating material such as SiOx and/or SiNx on the first substrate 10 using a deposition method such as PECVD.

Figure 8G:
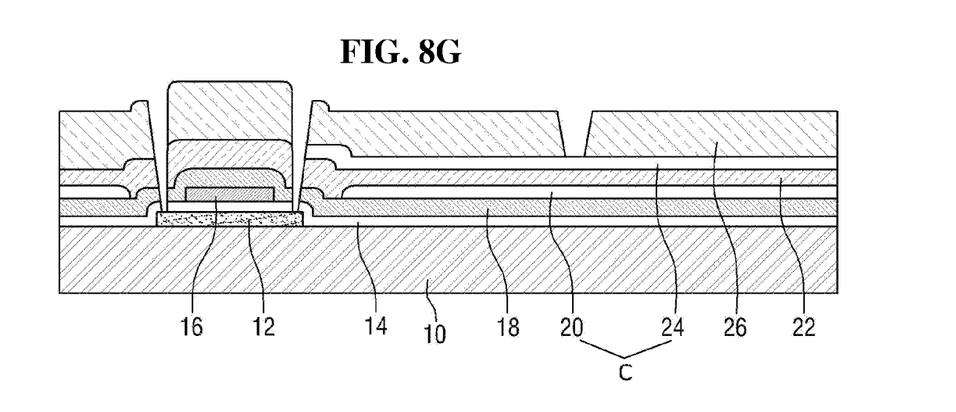

Referring to FIG. 8G, contact holes are formed to penetrate the interlayer insulating films 18, 22 and 26 and the gate insulating film 14 to expose part of the semiconductor layer 12. In a subsequent process, the source electrode 28 and the drain electrode 30 are deposited in the contact holes. When the contact holes are formed in the interlayer insulating films 18, 22 and 26 and the gate insulating film 14, another contact hole is also formed by etching a portion of the interlayer insulating film 26 disposed on the second electrode 24 of the storage capacitor C. The contact hole exposes a portion of the second electrode 24, and a connecting electrode 32 is deposited in this contact hole in a subsequent process.

Figure 8H:
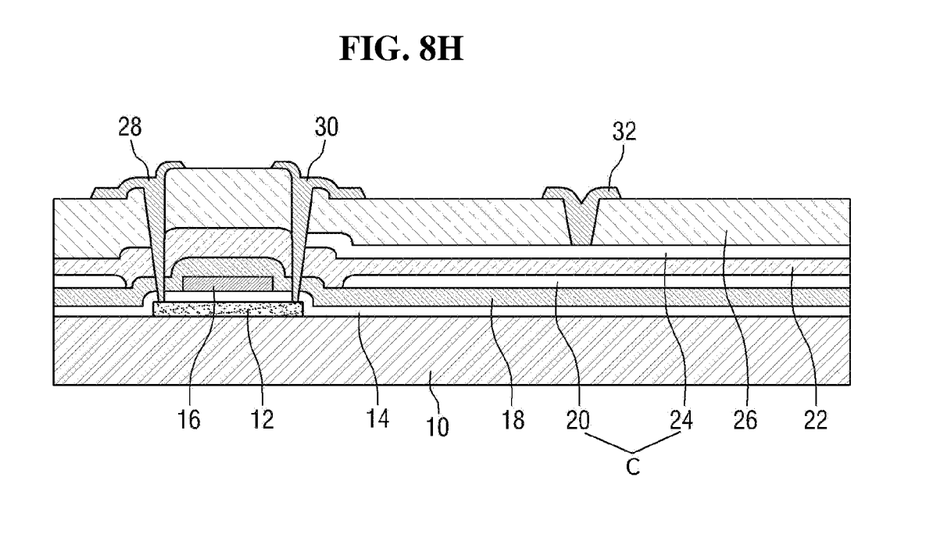

Referring to FIG. 8H, the source electrode 28, the drain electrode 30, and the connecting electrode 32 are formed. The source electrode 28, the drain electrode 30, and the connecting electrode 32 are formed using a deposition method such as sputtering. The source electrode 28, the drain electrode 30, and the connecting electrode 32 are formed by depositing a metal material (such as Mo or MoW) and then patterning the metal material using a photolithography process and an etching process.

To be electrically connected to the second electrode 24, the drain electrode 30 is formed to partially overlap the second electrode 24. The drain electrode 30 and the second electrode 24 are electrically connected to each other such that a data voltage (a driving voltage) applied to the drain electrode 30 via the source electrode 28 is charged in the storage capacitor C.

The connecting electrode 32 is formed on a region of the second electrode 24. The connecting electrode 32 may be located on a region of the second electrode 24 which is overlapped by a contact hole of a passivation film 34 which is to be formed later. The forming of the connecting electrode 32 may be performed at the same time as the depositing of the source and drain electrodes 28 and 30. In some embodiments, the connecting electrode 32 may be separated from the source and drain electrodes 28 and 30.

Figure 8I:
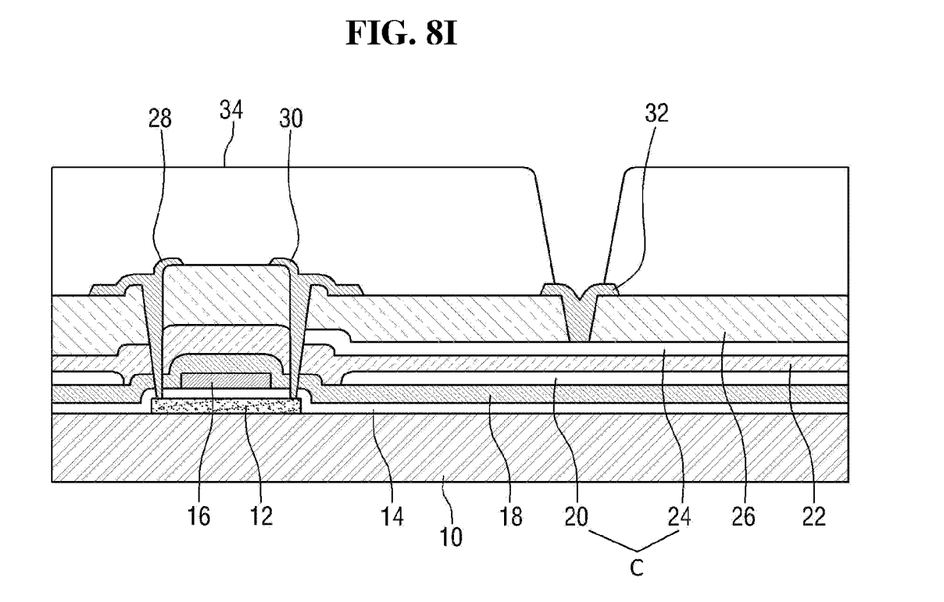

Referring to FIG. 8I, after the formation of the source electrode 28, the drain electrode 30 and the connecting electrode 32, the passivation film 34 is formed to cover the source electrode 28, the drain electrode 30 and the connecting electrode 32. The passivation film 34 is formed by PECVD, spin coating, or spinless coating.

Then, a contact hole is formed by patterning the passivation film 34 using a photolithography process and an etching process. In some embodiments, the contact hole may be located in a region of the passivation film 34 which overlaps the connecting electrode 32. The passivation film 34 is made of the same inorganic insulating material as the gate insulating film 14 or may be made of an organic insulating material such as acryl.

After the formation of the passivation film 34, a pixel electrode 36 may be formed on the passivation film 34. The pixel electrode 36 is formed using a deposition method such as sputtering. The pixel electrode 36 is electrically connected to the connecting electrode 32 via the contact hole of the passivation film 34. The pixel electrode 36 may be electrically connected to the second electrode 24 via the connecting electrode 32 and may control an electric field corresponding to a voltage charged in the storage capacitor C. The pixel electrode 36 may be made of a transparent conductive material such as ITO, TO, IZO or ITZO.

Embodiments where a common voltage Vcom is applied to the first electrode 20 and a driving voltage is applied to the second electrode 24 have been described. However, the present invention is not thus limited. In other embodiments, the driving voltage can also be applied to the first electrode 20, and the common voltage Vcom can also be applied to the second electrode 24, as described above.

In this configuration, the pixel electrode 36 can be connected either to the second electrode 24 or the first electrode 20.

As described above, if the first and second electrodes 20 and 24 are made of a transparent conductive material, an overlapping area of the first and second electrodes 20 and 24 can be increased regardless of an aperture ratio. Therefore, a high-capacitance storage capacitor C can be formed, which, in turn, improves the reliability of driving.

In embodiments of the present invention, the connecting electrode 32 made of a metal material is additionally formed in a region in which the second electrode 24 and the pixel electrode 36 contact each other, thereby minimizing an increase in resistance due to the transparent conductive material.

In addition, a storage wiring for applying the common voltage Vcom to an electrode of the storage capacitor C is removed, and the first electrode 20 is formed on the entire surface of the first substrate 10. This structure can increase the aperture ratio while preventing an increase in resistance due to the transparent conductive material.

Embodiments of the present invention provide at least one of the following advantages.

Lower and upper electrodes of a storage capacitor can be formed of a transparent conductive material to be as wide as the entire transmissive region of each pixel, thereby securing a high aperture ratio and sufficient capacitance.

Since the lower electrode and/or the upper electrode of the storage capacitor are/is formed on the entire surface of a substrate, an increase in resistance due to the transparent conductive material can be reduced.

However, the effects of the present invention are not restricted to the ones set forth herein. The above and other effects of the present invention will become more apparent to one of daily skill in the art to which the present invention pertains by referencing the claims.

In concluding the detailed description, those skilled in the art will appreciate that many variations and modifications can be made to the preferred embodiments without substantially departing from the principles of the present invention. Therefore, the disclosed embodiments of the invention are used in a generic and descriptive sense only and not for purposes of limitation.

What is claimed is:

1. A display device comprising:
    an insulating substrate comprising a first region and a second region;
    a TFT formed on the first region and comprising a gate electrode, a source electrode, and a drain electrode;
    a storage capacitor formed on the second region and comprising a first electrode, a second electrode formed on the first electrode, and a first interlayer insulating film formed between the first electrode and the second electrode; and
    a pixel electrode formed on the insulating substrate,
    wherein the first electrode and the second electrode comprise a transparent conductive material, the pixel electrode is electrically connected to the first electrode by a contact hole which penetrates the second electrode, the first electrode is electrically connected to the drain electrode, and a common voltage is applied to the second electrode.

2. The display device of claim 1, further comprising a connecting electrode formed between the pixel electrode and the first electrode.

3. The display device of claim 2, wherein the connecting electrode comprises the same material as the drain electrode of the TFT and is separated from the drain electrode.

4. The display device of claim 2, wherein the first interlayer insulating film comprises SiNx.

5. The display device of claim 1, wherein the first electrode is formed on the majority of the entire surface of the insulating substrate as one body.

* * * * *